(12) United States Patent
Wang et al.

(10) Patent No.: US 9,478,596 B2
(45) Date of Patent: Oct. 25, 2016

(54) DISPLAY DEVICE, DISPLAY PANEL AND MANUFACTURING METHOD THEREOF

(71) Applicants: Shanghai Tianma AM-OLED Co., Ltd., Shanghai (CN); Tianma Micro-Electronics Co., Ltd., Shenzhen (CN)

(72) Inventors: Yongzhi Wang, Shanghai (CN); Liyuan Luo, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/695,002

(22) Filed: Apr. 23, 2015

(65) Prior Publication Data

US 2016/0181343 A1  Jun. 23, 2016

(30) Foreign Application Priority Data

Dec. 23, 2014 (CN) .......................... 2014 1 0831443

(51) Int. Cl.
  *H01L 27/32* (2006.01)
  *H01L 51/56* (2006.01)
  *H01L 51/52* (2006.01)

(52) U.S. Cl.
  CPC ....... *H01L 27/3272* (2013.01); *H01L 51/5218* (2013.01); *H01L 51/5234* (2013.01); *H01L 2227/323* (2013.01); *H01L 2251/5315* (2013.01)

(58) Field of Classification Search
  CPC ........... H01L 27/3269; H01L 27/3272; H01L 51/5218; H01L 51/5234; H01L 2227/323; H01L 2251/5315

USPC ......................................................... 257/258
See application file for complete search history.

(56) References Cited

U.S. PATENT DOCUMENTS

| 4,472,367 | A | * | 9/1984 | Gibson | B01J 19/127 423/439 |
|---|---|---|---|---|---|
| 2004/0079940 | A1 | * | 4/2004 | Redecker | G03F 7/0035 257/40 |
| 2005/0054129 | A1 | * | 3/2005 | Chen | G02F 1/133345 438/30 |
| 2007/0257254 | A1 | * | 11/2007 | Yang | H01L 27/3269 257/40 |
| 2011/0114957 | A1 | * | 5/2011 | Kim | H01L 27/3272 257/59 |
| 2011/0147769 | A1 | * | 6/2011 | Kang | H01L 27/12 257/88 |
| 2012/0139866 | A1 | * | 6/2012 | Jung | G06F 3/0421 345/174 |

(Continued)

FOREIGN PATENT DOCUMENTS

CN  203133439 U  8/2013

*Primary Examiner* — Caridad Everhart
(74) *Attorney, Agent, or Firm* — Faegre Baker Daniels LLP

(57) ABSTRACT

A display device, display panel and manufacturing method thereof, where the display panel includes an array substrate including a plurality of thin film transistors, a pixel define layer disposed on the array substrate, and an organic light-emitting structure which is surrounded by the pixel define layer and of a top emission structure. The display panel further includes: a light blocking layer disposed between the array substrate and the pixel define layer and configured to prevent light passing through the pixel define layer from irradiating on the thin film transistor. By disposing the light blocking layer between the array substrate and the pixel define layer, light passing through the pixel define layer may be prevented from irradiating on the thin film transistor in the array substrate. Therefore, leakage current generated by the thin film transistor due to optical excitation may be reduced, thereby improving stability of the thin film transistor.

15 Claims, 3 Drawing Sheets

(56) References Cited

U.S. PATENT DOCUMENTS

2013/0343032 A1* 12/2013 Lee ................ G02B 5/3083
362/19

2014/0353606 A1* 12/2014 Choi ................ H01L 51/5228
257/40

2016/0118453 A1* 4/2016 Cho ................ H01L 27/3225
257/40

* cited by examiner

US 9,478,596 B2

DISPLAY DEVICE, DISPLAY PANEL AND MANUFACTURING METHOD THEREOF

CROSS-REFERENCE TO RELATED APPLICATION

This application claims priority to Chinese Application No. 201410831443.5, filed Dec. 23, 2014, which is herein incorporated by reference in its entirety.

TECHNICAL FIELD

This disclosure is related to display technology and in particular to display devices, display panels, and methods of manufacturing them.

BACKGROUND

An Organic Light Emitting Display (OLED) possesses characteristics such as self-illumination, low power consumption, high reaction speed, high contrast and wide viewing-angle.

FIG. 1 is a schematic structural diagram of a display panel in the related art. As shown in FIG. 1, the display panel is an OLED display panel and includes an array substrate 11, a glass cover-plate 12 disposed opposite to the array substrate 11, a planarization layer 13 disposed on a surface of the array substrate 11 at a side thereof close to the glass cover-plate 12, an organic light-emitting structure 14 disposed on the planarization layer, a pixel define layer (PDL) 15 surrounding the organic light-emitting structure 14, and a support 16 disposed on the pixel define layer 15 and configured to support the glass cover-plate 12. The array substrate 11 includes a plurality of thin film transistors (TFTs) 111, and the organic light-emitting structure 14 includes a reflection anode 141, an organic light-emitting layer 142 and a plane-shaped semi-transparent cathode 143 disposed on the array substrate 11 in sequence.

As shown in FIG. 1, the thin film transistor 111 disposed in the array substrate may be formed mainly by low temperature poly-silicon (LTPS) or oxide semiconductor, and the thin film transistor 111 formed by either of the LTPS or the oxide semiconductor is highly sensitive to light. When ambient light enters into the display panel, a part of the light will not irradiate on the array substrate 11 below the reflection anode 141 due to a reflection effect of the reflection anode 141, and the other part of the light irradiates on the thin film transistor 111 in the array substrate 11 after directly passing through the pixel define layer 15. In addition, light emitted by the organic light-emitting structure 14 also irradiates on the thin film transistor 111 after passing through the pixel define layer 15 due to reflection by the glass cover-plate 12 and the semi-transparent cathode 143. The above mentioned ambient direct light and the light reflected by the glass cover-plate 12 and the semi-transparent cathode 143 irradiate on the thin film transistor 111 after passing through the pixel define layer 15 so that the thin film transistor 111 generates leakage current due to optical excitation, thereby degrading stability of the thin film transistor 111.

SUMMARY

In view of the above, a display device, a display panel and a manufacturing method thereof are provided in embodiments of the present disclosure, so as to solve the technical problem in the related art that: stability of a thin film transistor is degraded by leakage current generated by the thin film transistor due to optical excitation when ambient direct light and the reflected light irradiate on the thin film transistor after passing through a pixel define layer.

In a first aspect, a display panel includes an array substrate including a plurality of thin film transistors, a pixel define layer disposed on the array substrate, and an organic light-emitting structure surrounded by the pixel define layer, where the organic light-emitting structure is of a top emission structure, and the display panel further includes a light blocking layer disposed between the array substrate and the pixel define layer and configured to prevent light passing through the pixel define layer from irradiating on the thin film transistor, according to embodiments of the disclosure.

In a second aspect, a display device including the display panel described in the first aspect is further provided, according to embodiments of the disclosure.

In a third aspect, a manufacturing method of a display panel is further provided, the method including forming an array substrate in which a plurality of thin film transistors are formed and forming an organic light-emitting structure and a pixel define layer surrounding the organic light-emitting structure on the array substrate, where the organic light-emitting structure is of a top emission structure, and a light blocking layer is formed between the array substrate and the pixel define layer and configured to prevent light passing through the pixel define layer from irradiating on the thin film transistor, according to embodiments of the disclosure.

As for the display device, the display panel and the manufacturing method, the light blocking layer is disposed between the array substrate and the pixel define layer of the display panel. Since the light blocking layer plays a role of blocking light, reflected light generated by reflecting, within the display panel, the ambient direct light from outside of the display panel and the light emitted by the organic light-emitting structure will be blocked by the light blocking layer after passing through the pixel define layer, and hence will not irradiate on the thin film transistor disposed in the array substrate. Therefore, leakage current generated by the thin film transistor due to optical excitation may be reduced, thereby improving stability of the thin film transistor.

While multiple embodiments are disclosed, still other embodiments will become apparent to those skilled in the art from the following detailed description, which shows and describes illustrative embodiments. Accordingly, the drawings and detailed description are to be regarded as illustrative in nature and not restrictive.

BRIEF DESCRIPTION OF THE DRAWINGS

Other features, objects and advantages of the disclosure will become apparent from the following detailed description made to nonrestrictive embodiments with reference to the accompanying drawings, in which.

Figure 1:
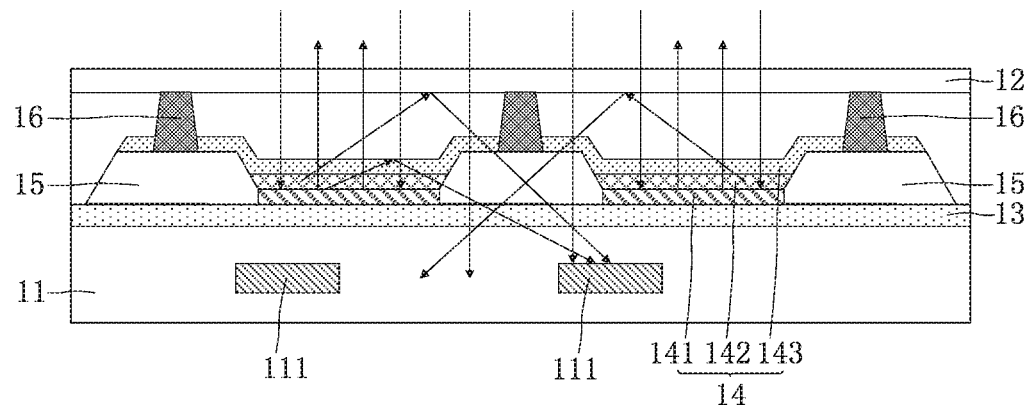
FIG. 1 is a schematic structural diagram of a display panel in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be further illustrated in detail below in conjunction with the accompanying drawings and embodiments. It should be understood that the specific embodiments described herein are merely for explaining the disclosure rather than limiting the disclosure. Additionally, it is noted that merely partial rather than all structures associated with the disclosure are illustrated in the accompanying drawings for ease of description.

Figure 2:
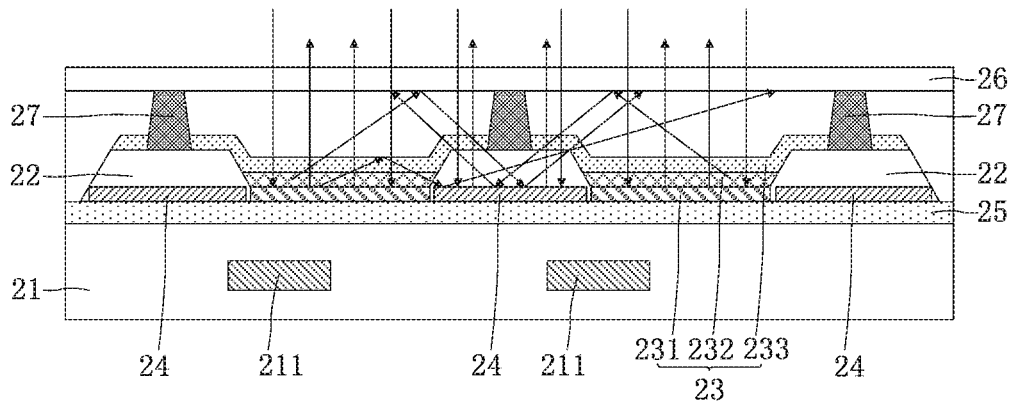
FIG. 2 is a schematic structural diagram of a display panel, according to embodiments of the disclosure.

FIG. 2 is a schematic structural diagram of a display panel. according to embodiments of the disclosure. As shown in FIG. 2, the display panel includes an array substrate 21 including a plurality of thin film transistors 211, a pixel define layer 22 disposed on the array substrate 21, and an organic light-emitting structure 23 surrounded by the pixel define layer 22, where the organic light-emitting structure 23 is of a top emission structure. The display panel further includes: a light blocking layer 24 disposed between the array substrate 21 and the pixel define layer 22 and configured to prevent light passing through the pixel define layer 22 from irradiating on the thin film transistor 211.

It is noted that the light blocking layer 24 may block light in a manner of reflecting light, absorbing light or any other manner, as long as light passing through the pixel define layer 22 can be prevented from irradiating on the thin film transistor 211.

As shown in FIG. 2, the display panel further includes: a plane-shaped planarization layer 25 disposed between the light blocking layer 24 and the array substrate 21, and a glass cover-plate 26 disposed opposite to the array substrate 21 and spaced from the pixel define layer 22 through a support 27 disposed on the pixel define layer 22, so that the array substrate 21, the glass cover-plate 26, the organic light-emitting structure 23 and the pixel define layer 22 which both are disposed between the array substrate 21 and the glass cover-plate 26 may be encapsulated as a box through an encapsulation process to form the display panel.

As shown in FIG. 2, the organic light-emitting structure 23 further includes a reflection anode 231, an organic light-emitting layer 232 and a semi-transparent cathode 233, where the reflection anode 231 is disposed on the array substrate 21, the organic light-emitting layer 232 is disposed on the reflection anode 231, and the semi-transparent cathode 233 is disposed on the organic light-emitting layer 232 and has a plane-shaped structure. The organic light-emitting structure 23 illuminates as per a principle that: in the event that the organic light-emitting structure 23 is powered up by applying a positive voltage (a specific size of which depends on a picture to be displayed by the display panel) to the reflection anode 231 and applying a constant negative voltage to the semi-transparent cathode 233, a voltage difference is formed between the reflection anode 231 and the semi-transparent cathode 233, therefore holes in the reflection anode 231 move towards the organic light-emitting layer 232 and electrons in the semi-transparent cathode 233 move towards the organic light-emitting layer 232, so that the holes and the electrons moving to the organic light-emitting layer 232 annihilate each other to release energy, thereby exciting material in the organic light-emitting layer 232 to illuminate. During displaying by the display panel, the display panel can achieve the desired display effects by controlling the illumination of the organic light-emitting structure 23.

It is noted that the above organic light-emitting structure 23 includes the reflection anode 231 and the semi-transparent cathode 233. Since the reflection anode 231 plays a role of reflecting light, light generated by the organic light-emitting layer 232 is emitted from the semi-transparent cathode 233 rather than from the reflection anode 231, and such organic light-emitting structure 23 is hence of a top emission structure which is defined relative to a bottom emission structure. As for the bottom emission structure, an anode of an organic light-emitting structure needs to be manufactured by transparent or semitransparent material, while a cathode of the organic light-emitting structure needs to be manufactured by light reflecting material, i.e. light emitted by the organic light-emitting layer is emitted from the anode instead of the cathode. In the present disclosure, the organic light-emitting structure 23 includes the top emission structure, so that light generated by the organic light-emitting layer 232 may be prevented by the reflection anode 231 from irradiating on the thin film transistor 211.

By disposing the light blocking layer 24 between the array substrate 21 and the pixel define layer 22, ambient light entering into the display panel irradiates on the light blocking layer 24 after directly passing through the pixel define layer 22. Moreover, reflected light generated by reflecting, by the semi-transparent cathode 233 and the glass cover-plate 26, the light emitted from the organic light-emitting structure 23 also irradiates on the light blocking layer 24 after passing through the pixel define layer 22. Since the light blocking layer 24 plays a role of blocking light, the above ambient direct light and the reflected light are blocked by the light blocking layer 24 after passing through the pixel define layer 22, and will no longer irradiate on the thin film transistor 211 disposed in the array substrate 21, so that leakage current generated by the thin film transistor 211 due to optical excitation is reduced, thereby improving stability of the thin film transistor 211.

Referring to FIG. 2, in some embodiments, the light blocking layer 24 and the reflection anode 231 are disposed at the same layer and, in some embodiments, made of the same material. Since the reflection anode 231 is made of light reflecting material, the ambient direct light and the reflected light which irradiate on the light blocking layer 24 after passing through the pixel define layer 22 may be reflected by the light blocking layer 24 and then emitted from the glass cover-plate 26, if the light blocking layer 24 and the reflection anode 231 are made of the same light reflecting material. Under the condition that the light blocking layer 24 and the reflection anode 231 are made of the same light reflecting material, not only the leakage current generated by the thin film transistor 211 due to the optical excitation may be reduced, thereby improving the stability of the thin film transistor 211, but also the ambient direct light and the reflected light passing through the pixel define layer 22 may be effectively utilized, thereby increasing a light extraction efficiency of the display panel.

Further, on the basis that the light blocking layer 24 and the reflection anode 231 are disposed on the same layer and made of the same material, the light blocking layer 24 and the reflection anode 231 can be formed by a synchronous manufacturing process, resulting in an advantage that there is no need for additional manufacturing processes, because the light blocking layer 24 can be manufactured while the reflection anode 231 is manufactured, thereby not only reducing processing steps for manufacturing the display panel but also reducing production costs of the display panel.

In some embodiments of the disclosure, in the case that the light blocking layer 24 and the reflection anode 231 are disposed at the same layer, a thickness of the light blocking layer 24 may be the same as or different from that of the reflection anode 231. A specific thickness of the light blocking layer 24 may be varied with the actual designs or requirements as long as light passing through the pixel define layer 22 can be prevented from irradiating on the thin film transistor 211, and the specific thickness of the light blocking layer 24 is not limited here.

Referring to FIG. 2, in some embodiments of the disclosure, a wave band of light blocked by the light blocking layer 24 may be in a range from 380 nm to 780 nm. It is known from the optical knowledge that light of such wave band is visible light. As mentioned above, the ambient light directly entering into the display panel may irradiate on the thin film transistor 211 disposed in the array substrate 21 after passing through the pixel define layer 22, and reflected light generated by reflecting, by the semi-transparent cathode 233 and the glass cover-plate 26, the light emitted from the organic light-emitting structure 23 may also irradiate on the thin film transistor 211 disposed in the array substrate 21 after passing through the pixel define layer 22. Red light (with a wave band in a range from 622 nm to 770 nm) from the ambient light directly entering into the display panel may pass through the pixel define layer 22, and green light (with a wave band in a range from 492 nm to 577 nm) and blue light (with a wave band in a range from 435 nm to 480 nm) emitted by the organic light-emitting structure 23 may also pass through the pixel define layer 22 after being reflected by the semi-transparent cathode 233 and the glass cover-plate 26. Since the red light, the green light and the blue light are all visible light, the light blocking layer 24 should be able to block light of a wave band of the visible light, so as to prevent the above light from irradiating on the thin film transistor 211 after passing through the pixel define layer 22.

Referring to FIG. 2, in some embodiments of the disclosure, unlike the case that the light blocking layer 24 and the reflection anode 231 are made of the same material, the light blocking layer 24 may also be made of light reflecting material which is different from material of the reflection anode 231. In some embodiments, the light reflecting material is high reflectivity material, so that not only the light blocking layer 24 prevents the light from irradiating on the thin film transistor 211, but also the light extraction efficiency of the display panel is improved. In some embodiments, a reflectivity of the high reflectivity material is not less than 90%. The higher the reflectivity is, the more the light reflected by the light blocking layer 24 is, and accordingly the light extraction efficiency of the display panel may be further increased. The above high reflectivity material may be silver, aluminum or other high reflectivity material and is not limited here.

Figure 3:
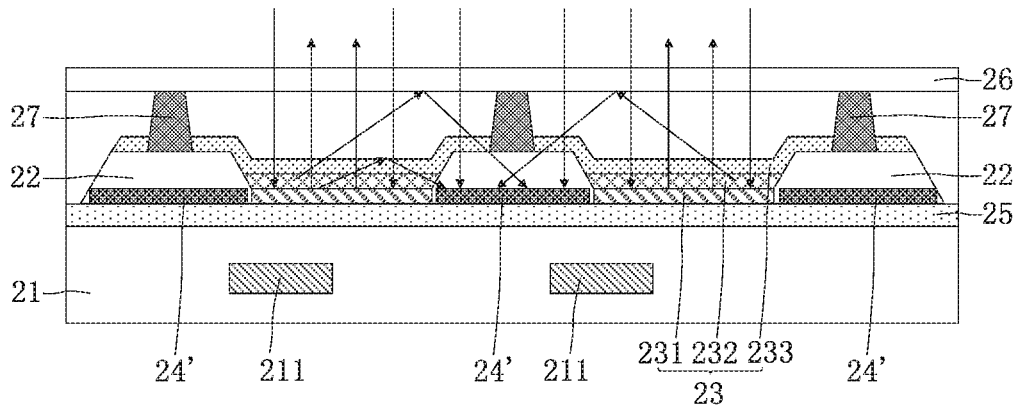
FIG. 3 is a schematic structural diagram of another display panel, according to embodiments of the disclosure.

In some embodiments, as shown in FIG. 2, the light blocking layer 24 is made of the light reflecting material and hence can reflect the light hitting its surface, that is, the light blocking layer 24 prevents the light from irradiating on the thin film transistor 211 disposed in the array substrate 21 by the light reflecting manner. In some embodiments, the light may be prevented from irradiating on the thin film transistor disposed in the array substrate by the light absorbing manner being adopted by the light blocking layer. As shown in FIG. 3, the light blocking layer 24' is made of the light absorbing material and hence can absorb the light hitting its surface, thereby preventing the light from irradiating on the thin film transistor 211. In some embodiments, the light absorbing material forming the light blocking layer 24' is high absorptivity material. The higher the absorptivity of the light absorbing material is, the less the light passing through the material is, and hence the light blocking layer 24' has a better light blocking effect to better prevent the light from irradiating on the thin film transistor 211, so that the stability of the thin film transistor 211 may be improved effectively. In some embodiments, the absorptivity of the high absorptivity material is not less than 90%. The above high absorptivity material is not limited here and may be one of chromium, chromium oxide, chromium nitride and black resin or other high absorptivity material.

Figure 4:
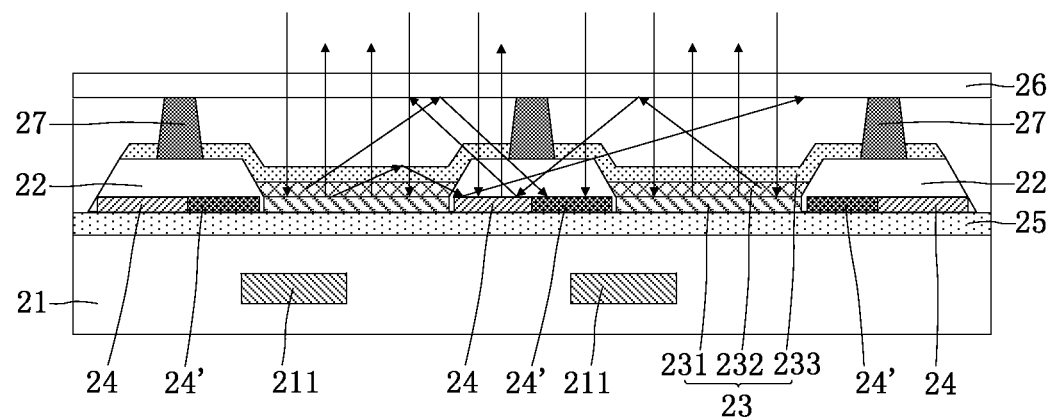
FIG. 4 is a schematic structural diagram of yet another display panel, according to embodiments of the disclosure.

Referring to FIG. 4, in some embodiments of the disclosure, a light blocking layer may include the light blocking layer 24 made of the light reflecting material and the light blocking layer 24' made of the light absorbing material. Such light blocking layer may not only prevent the light from irradiating on the thin film transistor 211 but also properly increase the light extraction efficiency of the display panel.

It is noted that the light blocking layer in FIG. 2 is fully made of the light reflecting material, the light blocking layer in FIG. 3 is fully made of the light absorbing material, and the light blocking layer in FIG. 4 consists of a light blocking layer made of the light reflecting material and a light blocking layer made of the light absorbing material. Besides the arrangement of the light blocking layers shown in FIGS. 2 to 4, the light blocking layer may also consist of any combination of a light blocking layer made of the light reflecting material and a light blocking layer made of the light absorbing material, for example, a part of the light blocking layer is fully made of the light reflecting material, and the other part of the light blocking layer is fully made of the light absorbing material; or a part of the light blocking layer is fully made of the light reflecting material, and the other part of the light blocking layer consists of a light blocking layer made of the light reflecting material and a light blocking layer made of the light absorbing material; or a part of the light blocking layer is fully made of the light absorbing material, and the other part of the light blocking layer includes a light blocking layer made of the light reflecting material and a light blocking layer made of the light absorbing material. Arrangements of the above light blocking layers all fall within the scope of the present disclosure.

Figure 5:
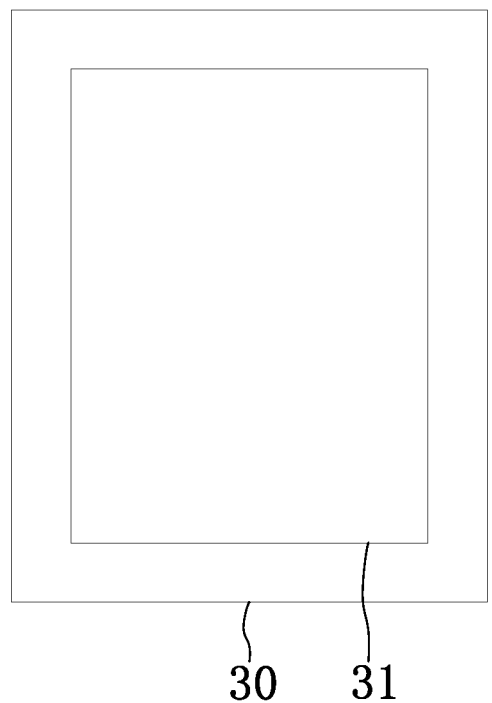
FIG. 5 is a schematic structural diagram of a display device, according to embodiments of the disclosure.

FIG. 5 is a schematic structural diagram of a display device, according to embodiments of the disclosure. As shown in FIG. 5, a display device 30 includes a display panel 31, and may further include other components for supporting the display device 30 to normally operate. The display panel 31 may be the display panel described in the above embodiments. The display device 30 may be a mobile phone, a tablet computer, an electronic paper, a digital photo frame or the like.

It is noted that the above display device may or may not possess a touch control function which may be selected and designed during actual manufacturing according to the specific requirements. The touch control function may be an electromagnetic touch control function, a capacitive touch control function, an electromagnetic-capacitive touch control function or the like.

Figure 6:
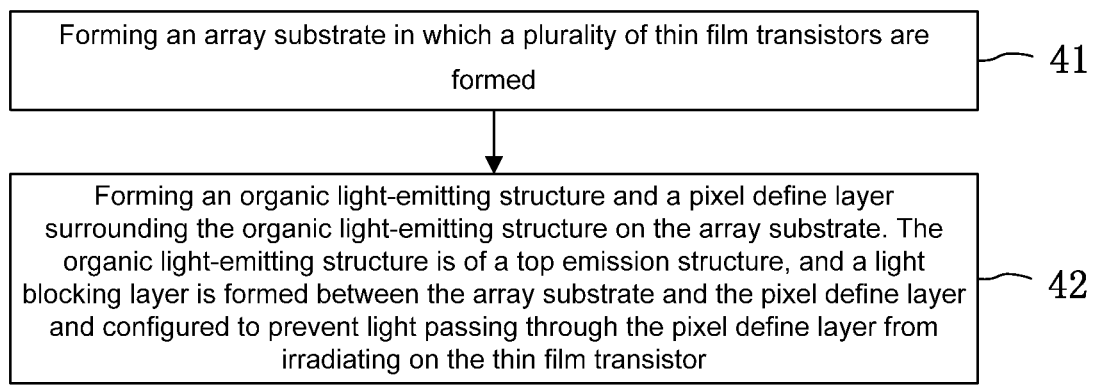
FIG. 6 is a flow chart of a manufacturing method of a display panel, according to embodiments of the disclosure.

A manufacturing method of a display panel is further provided in the disclosure, and the manufacturing method may be used for manufacturing the display panel described in the above embodiments. FIG. 6 is a flow chart of a manufacturing method of a display panel, according to embodiments of the disclosure. As shown in FIG. 6, the manufacturing method of the display panel at least includes the following steps:

Step 41: forming an array substrate in which a plurality of thin film transistors are formed.

The formed thin film transistor includes a gate electrode, a source electrode, a drain electrode and an active region disposed between the source electrode and the drain electrode. The gate electrode of the thin film transistor may be located above the source electrode and the drain electrode (thus forming a thin film transistor with a top gate structure), or located below the source electrode and the drain electrode (thus forming a thin film transistor with a bottom gate structure), and the location of the gate electrode is not limited here.

Step 42: forming an organic light-emitting structure and a pixel define layer surrounding the organic light-emitting structure on the array substrate. The organic light-emitting structure is of a top emission structure, and a light blocking layer is formed between the array substrate and the pixel define layer and configured to prevent light passing through the pixel define layer from irradiating on the thin film transistor.

In Step 42, during manufacturing of the light blocking layer, a deposition process and an etching process may be used, where the deposition includes, but is not limited to, atomic layer deposition, chemical vapor deposition, physical vapor deposition and the like, and a coating process, an exposure process and the like may also be used.

It is noted that detailed descriptions regarding the top emission structure may refer to the corresponding descriptions in the embodiments of the display panel and are not repeated here.

As such, the light blocking layer is formed between the array substrate and the pixel define layer through the above steps, and ambient light entering into the display panel may irradiate on the light blocking layer after directly passing through the pixel define layer. Moreover, reflected light generated by reflecting, within the display panel, the light emitted from the organic light-emitting structure also irradiate on the light blocking layer after passing through the pixel define layer. Since the light blocking layer plays a role of blocking light, the above mentioned ambient direct light and the reflected light will be blocked by the light blocking layer after passing through the pixel define layer, and hence will not irradiate on the thin film transistor disposed in the array substrate, so that leakage current generated by the thin film transistor due to the optical excitation is reduced, thereby improving stability of the thin film transistor.

In some embodiments of the disclosure, forming the organic light-emitting structure on the array substrate includes: forming a reflection anode of the organic light-emitting structure on the array substrate, and forming an organic light-emitting layer and a semi-transparent cathode of the organic light-emitting structure in sequence on the reflection anode. The reflection anode, the organic light-emitting layer and the semi-transparent cathode may enable the organic light-emitting structure to emit light when powered up. A principle regarding the illumination of the organic light-emitting structure may refer to the corresponding descriptions in the embodiments of the display panel and is not repeated here.

In some embodiments of the disclosure, the light blocking layer and the reflection anode are formed on the same layer, and, in some embodiments, the light blocking layer and the reflection anode are made of the same material and the synchronous manufacturing processes. Since the reflection anode is made of the light reflecting material, if the light blocking layer and the reflection anode are made of the same light reflecting material, the direct light and the reflected light irradiating on the light blocking layer after passing through the pixel define layer may be reflected by the light blocking layer, and the reflected light may be emitted from the glass cover-plate of the display panel. Under the condition that the light blocking layer and the reflection anode are made of the same light reflecting material, not only the leakage current generated by the thin film transistor due to the optical excitation may be reduced, thereby improving the stability of the thin film transistor, but also the direct light and reflected light passing through the pixel define layer may be effectively utilized, thereby increasing the light extraction efficiency of the display panel.

On the basis that the light blocking layer and the reflection anode are formed on the same layer and made of the same material, and the light blocking layer and the reflection anode can be formed by a synchronous manufacturing process. The advantage of such process is that there is no need to add additional manufacturing processes, so the light blocking layer can be manufactured while the reflection anode is manufactured, thereby not only reducing processing steps for manufacturing the display panel but also reducing production costs of the display panel.

In some embodiments of the disclosure, unlike the case that the light blocking layer and the reflection anode are made of the same material, the light blocking layer may also be made of light reflecting material different from material of the reflection anode. In some embodiments, the light reflecting material is high reflectivity material, so that not only the light blocking layer prevents the light from irradiating on the thin film transistor, but also the light extraction efficiency of the display panel is improved. In some embodiments, a reflectivity of the high reflectivity material is not less than 90%. The higher the reflectivity is, the more the light reflected by the light blocking layer is, and accordingly the light extraction efficiency of the display panel may be further increased. The above high reflectivity material may be silver, aluminum or other high reflectivity material and is not limited here.

The light blocking layer is made of the light reflecting material and reflects the light hitting its surface, so as to prevent the light from irradiating on the thin film transistor disposed in the array substrate. In addition to this, the light blocking layer which is made of the light absorbing material may also prevent the light from irradiating on the thin film transistor disposed in the array substrate. In some embodiments, the light absorbing material of the light blocking layer is the high absorptivity material. The higher the absorptivity of the light absorbing material is, the less the light passing through the material is, and thus the light blocking layer has a better light blocking effect to better prevent the light from irradiating on the thin film transistor, so that the stability of the thin film transistor may be improved effectively. In some embodiments, the absorptivity of the high absorptivity material is not less than 90%. The above high absorptivity material is not limited here and may be one of chromium, chromium oxide, chromium nitride and black resin or other high absorptivity material.

With the display device, display panel and the manufacturing method thereof provided in embodiments of the disclosure, the light blocking layer is disposed between the array substrate and the pixel define layer of the display panel. Since the light blocking layer plays a role of blocking light, after passing through the pixel define layer, the reflection light generated by reflecting the direct light from outside of the display panel and the light emitted by the organic light-emitting structure within the display panel would be blocked by the light blocking layer rather than irradiate on the thin film transistor disposed in the array substrate. Therefore, leakage current generated by the thin film transistor due to the optical excitation may be reduced, thereby improving the stability of the thin film transistor.

It should be noted that the above descriptions are embodiments of the disclosure and the technical principles used therein. It should be understood for those skilled in the art that the present disclosure is not limited to the particular embodiments described herein. Various apparent changes, readjustment and alternative can be made by those skilled in the art without departing from the scope of protection of the present disclosure. Therefore, although the disclosure is illustrated in detail through the above embodiments, the disclosure is not merely limited to the above embodiments. Further equivalent embodiments can also be included without departing the conception of the present disclosure. The scope of the present disclosure is subject to the appended claims.

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. Accordingly, the scope of the present disclosure is intended to embrace all such alternatives, modifications, and variations as fall within the scope of the claims, together with all equivalents thereof.

We claim:

1. A display panel, comprising:
    an array substrate including a plurality of thin film transistors;
    a pixel define layer disposed on the array substrate;
    an organic light-emitting structure surrounded by the pixel define layer, the organic light-emitting structure being of a top emission structure; and
    a light blocking layer disposed between the array substrate and the pixel define layer, wherein the light blocking layer is configured to prevent light passing through the pixel define layer from irradiating on the thin film transistor,
    wherein, the organic light-emitting structure has a reflection anode disposed on the array substrate, and the light blocking layer and the reflection anode are disposed on the same layer, and
    wherein, the light blocking layer and the reflection anode are made of the same material and are formed by a synchronous manufacturing process.

2. The display panel according to claim 1, wherein, thickness of the light blocking layer is the same as that of the reflection anode.

3. The display panel according to claim 1, wherein, the organic light-emitting structure further has an organic light-emitting layer and a semi-transparent cathode; wherein
    the organic light-emitting layer is disposed on the reflection anode; and
    the semi-transparent cathode is disposed on the organic light-emitting layer.

4. The display panel according to claim 1, wherein, the light blocking layer is configured to block light of a wave band in a range from 380 nm to 780 nm.

5. The display panel according to claim 1, further comprising:
    a plane-shaped planarization layer disposed between the light blocking layer and the array substrate; and
    a glass cover-plate disposed opposite to the array substrate and spaced from the pixel define layer through a support disposed on the pixel define layer.

6. The display panel according to claim 1, wherein, material of the light blocking layer is high reflectivity material.

7. The display panel according to claim 6, wherein, a reflectivity of the high reflectivity material is not less than 90%.

8. The display panel according to claim 6, wherein, the high reflectivity material is silver or aluminum.

9. The display panel according to claim 1, wherein, material of the light blocking layer is high absorptivity material.

10. The display panel according to claim 9, wherein, an absorptivity of the high absorptivity material is not less than 90%.

11. The display panel according to claim 9, wherein, the high absorptivity material is one of chromium, chromium oxide, chromium nitride and black resin.

12. A display device, comprising a display panel including:
    an array substrate including a plurality of thin film transistors;
    a pixel define layer disposed on the array substrate;
    an organic light-emitting structure surrounded by the pixel define layer, the organic light-emitting structure being of a top emission structure; and a light blocking layer disposed between the array substrate and the pixel define layer, wherein the light blocking layer is configured to prevent light passing through the pixel define layer from irradiating on the thin film transistor,
    wherein, the organic light-emitting structure has a reflection anode disposed on the array substrate, and the light blocking layer and the reflection anode are disposed on the same layer, and
    wherein, the light blocking layer and the reflection anode are made of the same material and are formed by a synchronous manufacturing process.

13. A manufacturing method of a display panel, comprising:
    forming an array substrate in which a plurality of thin film transistors are formed; and
    forming an organic light-emitting structure and a pixel define layer surrounding the organic light-emitting structure on the array substrate, wherein the organic light-emitting structure is of a top emission structure, and a light blocking layer is formed between the array substrate and the pixel define layer, wherein the light blocking layer is configured to prevent light passing through the pixel define layer from irradiating on the thin film transistor,
    wherein, forming the organic light-emitting structure on the array substrate includes: forming a reflection anode of the organic light-emitting structure on the array substrate,
    wherein, the light blocking layer and the reflection anode are formed on the same layer, and
    wherein, the light blocking layer and the reflection anode are made of the same material and are formed through a synchronous manufacturing process.

14. The manufacturing method of the display panel according to claim 13, wherein, forming the organic light-emitting structure on the array substrate further includes:
forming an organic light-emitting layer and a semi-transparent cathode of the organic light-emitting structure on the reflection anode in sequence.

15. The manufacturing method of the display panel according to claim 13, wherein, the light blocking layer is made of high reflectivity material or high absorptivity material.

* * * * *